United States Patent [19]
Saishouji et al.

[11] Patent Number: 5,968,262
[45] Date of Patent: Oct. 19, 1999

[54] METHOD OF FABRICATING SILICON SINGLE CRYSTALS

[75] Inventors: Toshiaki Saishouji; Kouzou Nakamura; Toshimichi Kubota; Junsuke Tomioka, all of Kanagawa, Japan

[73] Assignee: Komatsu Electronic Metals Co., Ltd., Kanagawa, Japan

[21] Appl. No.: 08/976,340

[22] Filed: Nov. 21, 1997

[30] Foreign Application Priority Data

Nov. 21, 1996 [JP] Japan .................................. 8-326138

[51] Int. Cl.$^6$ .................................................. C30B 15/20
[52] U.S. Cl. .................................................. 117/13; 117/15
[58] Field of Search .................................. 117/13, 14, 15, 117/20

[56] References Cited

U.S. PATENT DOCUMENTS 5,728,211  3/1998  Takano et al. .......................... 117/14
5,817,171  10/1998  Sakurada et al. ....................... 117/13

Primary Examiner—Felisa Hiteshew
Attorney, Agent, or Firm—Sughrue, Mion, Zinn, Macpeak & Seas, PLLC

[57] ABSTRACT

When the pulling speed is V(mm/min), the temperature gradient along the crystal axis within the temperature range from the melting point of silicon to 1300° C. is G1 (° C./mm), the temperature gradient along the crystal axis within the temperature range from 1150° to 1080° C. is G2 (° C./mm), and the octahedral-shaped void density is d (pieces/cm$^3$), crystals are grown under a condition satisfying:

$V/G1 > 0.581 \times V \times G2 - (d - 4.3 \times 10^3)/2.65 \times 10^6$ and $V/G1 > 0.25$.

In this way, the defect density is reduced to less than 1×10⁶ pieces/cm$^3$ and silicon single crystals having superior gate oxide integrity and semiconductor device yield are obtained.

2 Claims, 2 Drawing Sheets

METHOD OF FABRICATING SILICON SINGLE CRYSTALS

BACKGROUND OF THE INVENTION

1. Field of the Invention

The invention relates to a method of fabricating silicon ingle crystals by the CZ method, particularly to a method of fabricating silicon single crystals with superior gate oxide integrity characteristics.

2. Description of the Related Art

Silicon single crystals are generally produced by the CZ method. In the CZ method, polysilicons are fed into a quartz crucible disposed in a single crystal-fabricating apparatus, and then the raw material is heated and melted by heaters disposed surrounding the quartz crucible. Thereafter, a seed crystal mounted on a seed chuck is dipped into the melt. The seed chuck and the quartz crucible are then rotated in the same or reverse direction while pulling the seed chuck to grow a silicon single crystal of a predetermined diameter and length.

It is well known that as-grown silicon single crystals fabricated by the CZ method comprises octahedral void like defects. These defects are detected with infrared scattering tomography(hereinafter referred as LSTD, LSTD: Laser Scattering Tomography Defect). LSTDs exist in almost all single crystals at a density exceeding $1 \times 10^6$ pieces/cm$^3$.

In recent years, with the scaling-down and higher integration of semiconductor devices, the gate oxide integrity has particularly received attention. FIG. 2 shows the relationship between LSTD density and the gate oxide integrity yield, in which when the LSTD density is greater than $1 \times 10^6$ pieces/cm$^3$, and the gate oxide integrity yield is below 50%. FIG. 3 shows the relationship between the gate oxide integrity yield and the reliability failure of semiconductor devices (Semiconductor Silicon (1994), 937–986), in which when the gate oxide integrity yield falls below than 50%, and the reliability failure rises significantly. In view of the above, the reduction of LSTD density is the most important issue for the growth of silicon single crystals grown by the CZ method (hereinafter referred as CZ-Si single crystal). It is necessary to reduce the LSTD density of the as-grown CZ-Si single crystal to less than $1 \times 10^6$ pieces/cm$^3$.

Up to now, as a method of reducing the density of oxygen precipitates of CZ-Si single crystals, which is associated with the gate oxide integrity, it has been proposed to grow the single crystals at a growth rate of less than 0.8 mm/min (see JP-A-2-267195, JP-A-:unexamined published Japanese application). Also, it has been proposed to grow singe crystals with a fp/G coefficient being greater than 0.25 mm$^2$/° C. min., wherein fp (mm/min) is the crystal growth rate and the G (° C./mm) is the temperature gradient along the crystal axial direction in the temperature range from the melting point of silicon to 1300° C.; and the cooling rate in the range from 1150° C. to 1000° C. are less than 2.0° C./min (see JP-A- 8-12493).

According to the fabricating method of silicon single crystals disclosed in JP-A- 8-12493, the fp/G coefficient is used as the parameter for controlling the outer diameter of the ring like oxidation induced stacking fault (hereinafter referred as OSF) that occur in the thermal oxidation process after the processing of wafers distributed in the wafer periphery portion which is not used in the semiconductor device fabricating step, and the cooling rate in the range from 1150° C. to 1000° C. is specified as a parameter for controlling the LSTD density. That is, with respect to the above two objectives, each parameter is specified.

The relation between the defects that occur in the silicon single crystals and the cooling process of the crystal growth has been reported in a large number of reports. And when the crystal pulling rate is V(mm/min), the temperature gradient along the crystal axis within the temperature range from melting point of silicon to 1300° C. is G1(° C./min:G1>0), the temperature gradient along the crystal axis within the temperature range from 1150° C. to 1080° C. is G2 (° C./min:G2>0), the relationship between the parameters of V/G1, V×G2 and the crystal defects, has also been reported respectively. First, V/G1 is the parameter for determining the sites where OSF occur in the diameter direction of crystals has been described in Materials Sciences Forum Vols. 196–201 (1995) pp. 1713–1718 and Journal of Crystal Growth 151 (1995) pp. 273–277. It goes without saying that if ring-shaped OSF inside the wafer will have a deleterious effect on the fabrication of semiconductor devices. Even if in the outer region of ring-shaped OSF dislocation may occur and the getting ability of heavy metals may be reduced. Accordingly, commercialized wafers are manufactured with the V/G1 greater than a certain critical value so as to keep the wafers within the inside of the ring-shaped OSF.

Moreover, the determination of the varieties of the so-called generating defects which are the secondary defects, A defects and B defects, caused by the interstitial silicon atom, and the secondary defects, D defects, caused by the vacancies, has also been reported, (Journal of Crystal Growth 59 (1982) 625–643). It is presumed that the above parameters dominate the concentration of the point defects (interstitial silicon atom and vacancy) induced in the growing process, and ore or less influence the formation of the LSTD which is considered as the aggregate of the vacancies.

V×G2 is corresponding to the cooling rate of the growing silicon single crystal within the range of 1150° C. to 1080° C. There is a good relation between the cooling rate and the LSTD density, as reported in Materials Science Forum Vols. 196–201 (1995) pp. 1707–1712.

As described above, conventionally the parameters V/G1 V×G2 were only controlled respectively so as to satisfy each of objects.

SUMMARY OF THE INVENTION

In contrast to this, the inventors of the invention aim at the point what the LSTD density is affected by the cooling processes of two temperature zones in the growth of crystals, i.e., the temperature zone from the melting point of silicon to 1300° C. and the temperature zone from 1150° C. to 1080° C. It goes without saying that from public documents and publications, it is known that the parameter of the cooling rate in the temperature zone surrounding 1100° C., such as 1150° C. to 1080° C. or 1150° C. to 1000° C., affects the LSTD density. The influence of the parameter, pulling rate/temperature gradient from the melt to 1300° C., however, is rather small, but also affect the LSTD density. Accordingly, the above two parameters must be considered in order to precisely control the LSTD density.

In view of the above, an object of the invention is to provide a method for fabricating silicon single crystals so as to reduce the LSTD density in the as-grown CZ-Si single crystals and thereby obtain wafers having excellent gate oxide integrity characteristics.

To achieve the above object, the invention consists of a method for fabricating silicon single crystals by the CZ method that is characterized by growing crystals under a condition satisfying the equation:

$V/G1 > 0.581 \times V \times G2 - (d-4.3 \times 10^3)/2.65 \times 10^6$ and $V/G1 > 0.25$ wherein V(mm/min) is the crystal pulling rate, G1 (° C./min) is the temperature gradient along the crystal axis in the temperature range from the melting point of silicon to 1300° C., G2 (° C./min) is the temperature gradient along the crystal axis in the temperature range from 1150° C. to 1080° C., and d (pieces/cm$^3$) is the LSTD density.

According to the above, in order to obtain the predetermined target LSTD density, the necessary cooling conditions of silicon single crystals, i.e., the temperature gradient in the crystal axis within the two temperature ranges from the melting point of silicon to 1300° C. and from 1150° C. to 1080° C., and the crystal pulling speed, is first computed by the above equations. By pulling the single crystals under the computed cooling conditions, silicon single crystals with low LSTD density are obtained. Preferably the condition is determined so that d is less than $1 \times 10^6$ (/cm$^3$).

BRIEF DESCRIPTION OF THE DRAWINGS

The examples of fabricating silicon single crystals according to the invention are hereinafter described with reference to the drawings, wherein.

DETAILED DESCRIPTION OF THE PREFERRED EMBODIMENTS

The inventors of present invention confirm that the LSTD is formed in the temperature zone from 1150° C. to 1080° C., and by slowing down the cooling rate of this temperature zone, the LSTD density can be reduced.

Hence, the inventors of present invention have investigated the relationship between the LSTD density of single crystals grown under various conditions and V/G1 and V×G2. Consequently, it is understood that the LSTD density is associated with V/G1 and V×G2.

It is found that it is necessary to grow crystals in the range of $V/G1 > 0.581 \times V \times G2 - (d-4.3 \times 10^3)/2.65 \times 10^6$ to obtain crystals with a LSTD density below $1 \times 10^6$ pieces/cm$^3$. In addition, as is described above, V/G1 is the parameter determining the occurring sites of the ring-shaped OSF, and thus it is necessary to concurrently satisfy the condition: V/G1>0.25 so as to make ring-shaped OSF disappear in the periphery of the crystals.

Silicon single crystals were grown by using 10 fabricating conditions according to the fabricating method of the invention and 12 fabricating conditions according to the prior art, with V/G1 and V×G2 as parameters. These silicon single crystals were fabricated by doping polysilicon with boron, and pulling the same in different fabricating devices and hot zones, with a crystal diameter of 100~200 mm and a <100> crystalline orientation. The values of the crystal pulling rate V, V/G1, V×G2, and the LSTD density are summarized in Table 1. According to the examples of the invention, the target LSTD density was first determined, and the V, V/G1, and V×G2 for achieving the target value were then computed and used as the fabricating parameters. According to the examples of the prior art, the pulling speed V, the temperature gradients G1 and G2 were properly determined, and then the LSTD densities of silicon single crystals were measured.

TABLE 1

| | Fabricating conditions | | LSTD Density | |
|---|---|---|---|---|
| | Pulling rate V (mm/min) | V × G2 (° C./min) | V/G1 (mm$^2$/° C. min) | d (× 10$^6$/cm$^3$) |
| | Examples of the invention | | | |
| A | 0.70 | 1.4000 | 0.4952 | 0.7 |
| B | 0.53 | 1.0027 | 0.3549 | 0.6 |
| C | 0.64 | 1.0927 | 0.3943 | 0.5 |
| D | 0.64 | 0.9532 | 0.3943 | 0.3 |
| E | 0.80 | 1.1667 | 0.4786 | 0.4 |
| F | 0.64 | 1.0927 | 0.3429 | 0.8 |
| G | 0.65 | 1.0581 | 0.3424 | 0.8 |
| H | 0.58 | 0.9022 | 0.3211 | 0.4 |
| I | 0.59 | 0.7121 | 0.2845 | 0.3 |
| J | 0.75 | 1.0294 | 0.3214 | 0.6 |
| | Examples of the prior art | | | |
| K | 0.83 | 1.6154 | 0.2732 | 2.5 |
| L | 1.17 | 2.4818 | 0.3447 | 4.0 |
| M | 0.72 | 1.3622 | 0.2829 | 2.4 |
| N | 0.70 | 1.4848 | 0.3563 | 2.5 |
| O | 0.75 | 1.5012 | 0.3984 | 2.0 |
| P | 0.70 | 1.3611 | 0.3500 | 2.3 |
| Q | 0.80 | 1.7500 | 0.3125 | 3.5 |
| R | 1.00 | 2.500 | 0.2768 | 4.2 |
| S | 0.64 | 1.3576 | 0.3527 | 2.6 |
| T | 0.65 | 1.2639 | 0.3134 | 2.0 |
| U | 0.78 | 1.1870 | 0.2716 | 2.2 |
| V | 1.30 | 2.3947 | 0.6964 | 2.8 |

Figure 1:
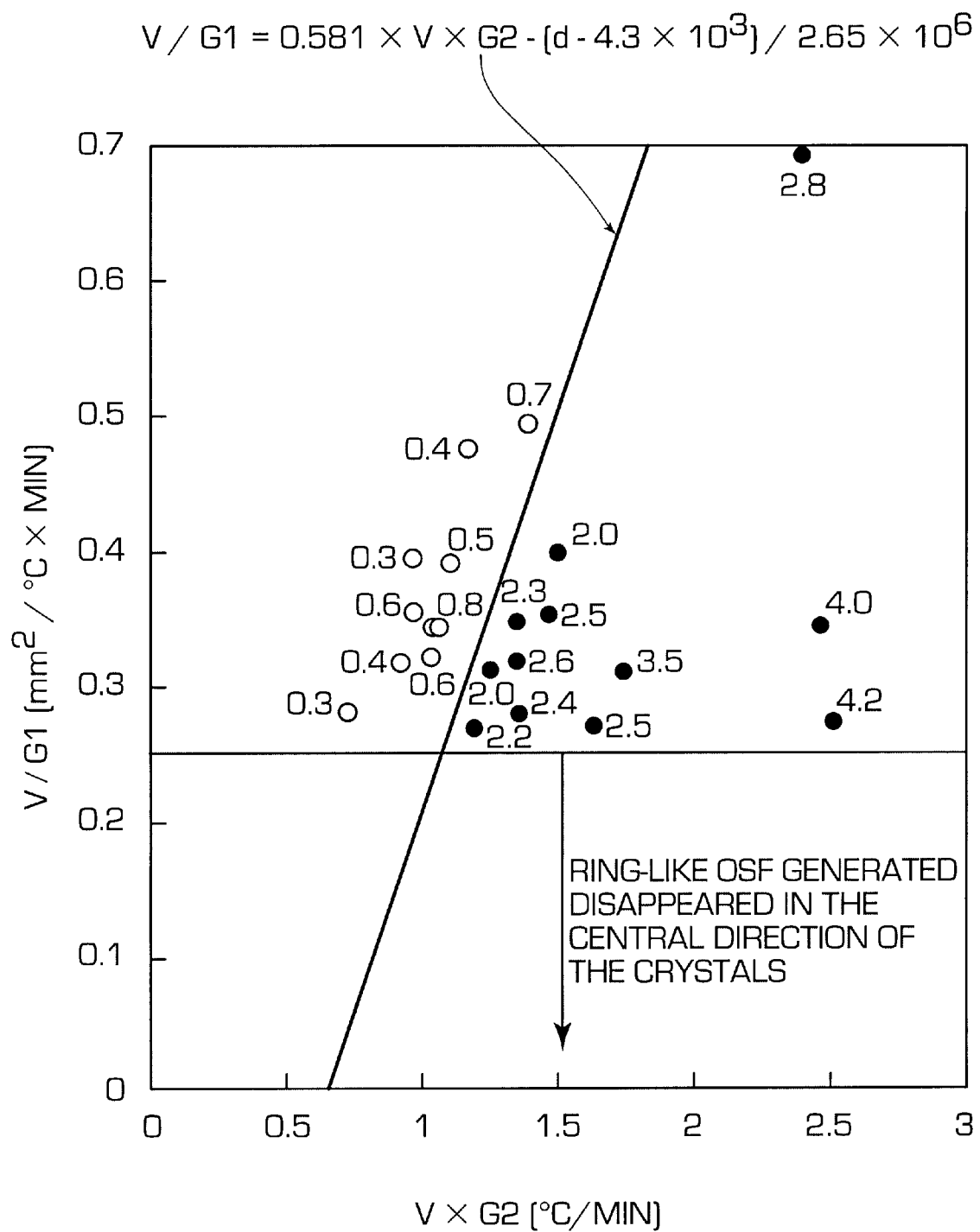
FIG. 1 is a graph showing the relationship between the V/G1, V/×G2 and the LSTD density which are measured in the embodiment of the present invention.
Figure 2:
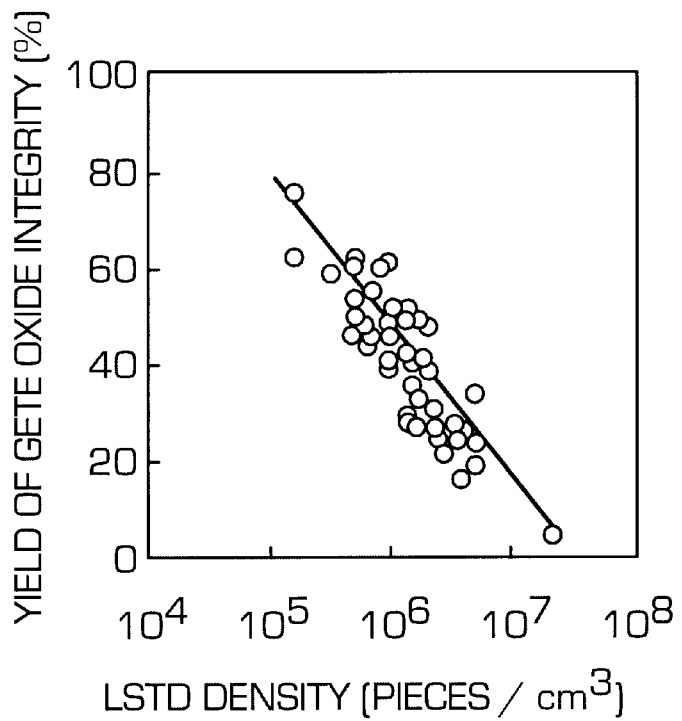
FIG. 2 is a graph showing the relationship between the LSTD density existed in the as-grown CZ-Si single crystals and the gate oxide integrity yield(from related document)
Figure 3:
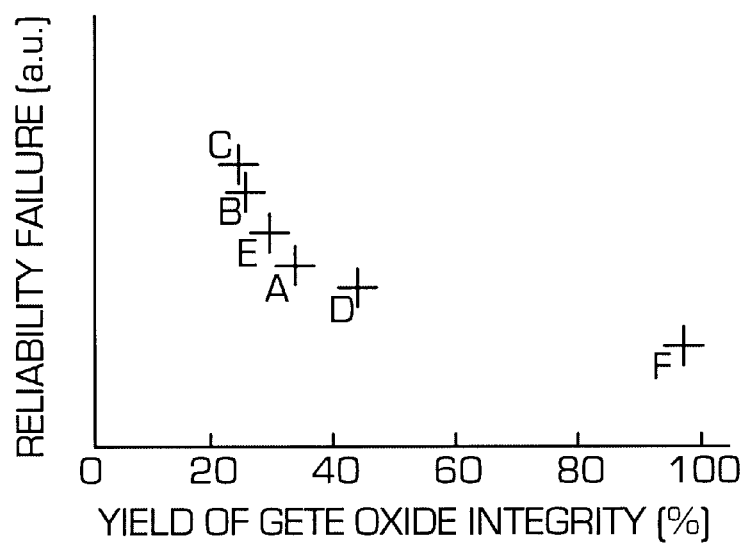
FIG. 3 is a graph showing the relationship between the gate oxide integrity yield and the reliability failure of the semiconductor device(from related document).

The relationship between V/G1, V×G2 and the LSTD density for the silicon single crystals obtained according to the fabricating conditions set forth in Table 1 is shown in FIG. 1. In this graph, o denotes a sample whose LSTD density is less than $1 \times 10^6$ pieces/cm3, and * denotes a sample whose LSTD density is greater than $1 \times 10^6$ pieces/cn$^3$. The boundary line is the straight line represented by $V/G1 = 0.581 \times V \times G2 - (d-4.3 \times 10^3)/2.65 \times 10^6$ at $d = 1 \times 10^6$. In addition, the numerals adjacent to the plotted dots are the LSTD density ($\times 10^6$ pieces/cm$^3$) Furthermore, ring-shaped OSF occurs when V/G1<0.25, and when the V/G1 value approaches to zero, the ring-shaped OSF disappears in the central direction of the crystals. Accordingly, by pulling single crystals at a crystal pulling rate satisfying the cooling conditions based on the computed formulas, it is possible to manufacture CZ-Si single crystals having a defect density of less than $1 \times 10^6$ pieces/cm$^3$ and superior gate oxide integrity and device yield.

As described above, according the invention, in order to precisely control the octahedral void defect density to a desired low value in all CZ-Si single crystals, the formulas for determining the crystal pulling conditions in the two temperature range: from silicon melting point to 1300° C. and from 1150° C. to 1080° C., are computed. Thereafter, single crystals are pulled at a crystal pulling rate satisfying the cooling conditions based on the computed formulas. And thus it is possible to manufacture CZ-Si single crystals having a defect density of less than $1 \times 10^6$ pieces/cm$^3$ and superior gate oxide integrity and device yield.

What is claimed is:

1. A method of fabricating silicon single crystals by the CZ method, characterized by growing crystals under a condition satisfying:

$V/G1 > 0.581 \times V \times G2 - (d-4.3 \times 10^3)/2.65 \times 10^6$ and $V/G1 > 0.25$ wherein V(mm/min) is the crystal pulling rate, G1(° C./min) is the temperature gradient along the crystal axis in the temperature range from the melting point of silicon to 1300° C., G2(° C./min) is the temperature gradient along the crystal axis in the temperature range from 1150° C. to 1080° C., and d (pieces/cm$^3$) is the LSTD density.

2. The method of fabricating silicon single crystals by the CZ method as claimed in claim 1, wherein the condition is determined so that d is less than $1 \times 10^6$ (pieces /cm$^3$).

* * * * *